United States Patent
Okamoto et al.

(10) Patent No.: US 8,659,055 B2
(45) Date of Patent: Feb. 25, 2014

(54) SEMICONDUCTOR DEVICE, FIELD-EFFECT TRANSISTOR, AND ELECTRONIC DEVICE

(75) Inventors: Yasuhiro Okamoto, Tokyo (JP); Kazuki Ota, Tokyo (JP); Takashi Inoue, Tokyo (JP); Hironobu Miyamoto, Tokyo (JP); Tatsuo Nakayama, Tokyo (JP); Yuji Ando, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/497,557

(22) PCT Filed: Jun. 16, 2010

(86) PCT No.: PCT/JP2010/060162
§ 371 (c)(1),
(2), (4) Date: Jun. 4, 2012

(87) PCT Pub. No.: WO2011/036921
PCT Pub. Date: Mar. 31, 2011

(65) Prior Publication Data
US 2012/0228674 A1    Sep. 13, 2012

(30) Foreign Application Priority Data
Sep. 22, 2009  (JP) ................... 2009-218295

(51) Int. Cl.
*H01L 29/66*  (2006.01)
*H01L 21/336*  (2006.01)

(52) U.S. Cl.
USPC ............. 257/194; 257/192; 257/E29.246; 438/271

(58) Field of Classification Search
USPC ........... 257/192, E29.255, E29.091, E29.246, 257/E27.014; 438/270–271
See application file for complete search history.

(56) References Cited

U.S. PATENT DOCUMENTS

| | | | |
|---|---|---|---|
| 7,804,106 B2 * | 9/2010 | Makimoto et al. | 257/103 |
| 8,044,434 B2 * | 10/2011 | Ohta et al. | 257/194 |
| 2005/0224831 A1 | 10/2005 | Makimoto et al. | |
| 2010/0006894 A1 * | 1/2010 | Ohta et al. | 257/192 |
| 2010/0078688 A1 * | 4/2010 | Otake et al. | 257/288 |
| 2010/0327318 A1 * | 12/2010 | Okamoto et al. | 257/192 |

FOREIGN PATENT DOCUMENTS

| | | | |
|---|---|---|---|
| JP | 2006-313859 A | 11/2006 | |
| JP | 2006-324279 A | 11/2006 | |
| JP | 2007-59719 A | 3/2007 | |
| JP | 2007-134517 A | 5/2007 | |
| JP | 2007-142243 A | 6/2007 | |
| WO | 2004/061971 A1 | 7/2004 | |
| WO | 2008/023737 A1 | 2/2008 | |
| WO | WO 2008023737 A1 * | 2/2008 | |
| WO | 2009/119479 A1 | 10/2009 | |
| WO | WO 2009119479 A1 * | 10/2009 | |

OTHER PUBLICATIONS

Wiley, John & Sons, "Physics of Semiconductor Devices", 2nd edition, 1981, Section 2-3.
O. Ambacher et al., "Pyroelectric properties of Al(In)GaN/GaN hetero- and quantum well structures", Journal of Physics: Condensed Matter, 2002, pp. 3399-3434, vol. 14.
Hirotaka Otake et al., "GaN-Based Trench Gate Metal Oxide Semiconductor Field Effect Transistors with Over 100 cm2/(V s) Channel Mobility", Japanese Journal of Applied Physics, 2007, pp. L599-L601, vol. 46, No. 25.
International Search Report for PCT/JP2010/060162 filed Sep. 21, 2010.

* cited by examiner

*Primary Examiner* — Cheung Lee
*Assistant Examiner* — Jeremy Joy
(74) *Attorney, Agent, or Firm* — Sughrue Mion, PLLC

(57) ABSTRACT

Provided is a semiconductor device capable of suppressing an occurrence of a punch-through phenomenon.
A semiconductor device includes a substrate 1, a first n-type semiconductor layer 2, a p-type semiconductor layer 3, a second n-type semiconductor layer 4, a drain electrode 13, a source electrode 11, a gate electrode 12, and a gate insulation film 21, wherein the first n-type semiconductor layer 2, the p-type semiconductor layer 3, and the second n-type semiconductor layer 4 are laminated on the substrate 1 in this order. The drain electrode 13 is in ohmic-contact with the first n-type semiconductor layer 2. The source electrode 11 is in ohmic-contact with the second n-type semiconductor layer 4. An opening portion to be filled or a notched portion that extends from an upper surface of the second n-type semiconductor layer 4 to an upper part of the first n-type semiconductor layer 2 is formed at a part of the p-type semiconductor layer 3 and a part of the second n-type semiconductor layer 4. The gate electrode 12 is in contact with an upper surface of the first n-type semiconductor layer 2, side surfaces of the p-type semiconductor layer 3, and side surfaces of the second n-type semiconductor layer 4 at inner surfaces of the opening portion to be filled or a surface of the notched portion via the gate insulation film 21. The p-type semiconductor layer 3 has a positive polarization charge at a first n-type semiconductor layer 2 side in a state where a voltage is applied to none of the electrodes.

11 Claims, 12 Drawing Sheets

SEMICONDUCTOR DEVICE, FIELD-EFFECT TRANSISTOR, AND ELECTRONIC DEVICE

CROSS REFERENCE TO RELATED APPLICATIONS

This application is a National Stage of International Application No. PCT/JP2010/060162 filed Jun. 16, 2010, claiming priority based on Japanese Patent Application No. 2009-218295 filed Sep. 22, 2009, the contents of all of which are incorporated herein by reference in their entirety.

TECHNICAL FIELD

The present invention relates to semiconductor devices, field effect transistors, and electronic devices.

BACKGROUND ART

Among semiconductor devices, field effect transistors (FETs) are used widely in various electronic devices.

FIG. 11A shows an example of the structure of a field effect transistor. FIG. 11A is a cross sectional view schematically showing the semiconductor structure of the vertical GaN field effect transistor (hereinafter, referred to as a vertical GaN FET) described in Non-Patent Document 1. As shown in FIG. 11A, in this vertical GaN FET, an i-type GaN layer 101' is laminated on the upper surface of a sapphire substrate 110. Further, on the upper surface of the i-type GaN layer 101', a high concentration n-type GaN layer 107 is laminated. On a part of the upper surface of the high concentration n-type GaN layer 107, an n-type GaN layer 102, a p-type GaN layer 103, and an n-type GaN layer 104 are laminated in this order. On parts of the upper surface of the high concentration n-type GaN layer 107 where the aforementioned layers are not laminated, drain electrodes 113 are in ohmic-contact with the high concentration n-type GaN layer 107. On the upper surface of the n-type GaN layer 104, source electrodes 111 are in ohmic-contact with the n-type GaN layer 104. On the upper surface of the high concentration n-type GaN layer 107, the side surfaces of the n-type GaN layer 102, the side surfaces of the p-type GaN layer 103, and the upper surface and the side surfaces of the n-type GaN layer 104, except for the areas where the source electrodes 111 and the drain electrodes 113 are formed, a gate insulation film 121 is laminated. A part of the upper part of the n-type GaN layer 102, a part of the p-type GaN layer 103, and a part of the n-type GaN layer 104 are removed to form an opening portion to be filled. A gate electrode 112 is formed so as to fill the opening portion to be filled via the gate insulation film 121 and is in contact with the n-type GaN layer 102, the p-type GaN layer 103, and the n-type GaN layer 104. This vertical GaN FET can control the concentration of electrons accumulated at the interface between the p-type GaN layer 103 and the gate insulation film 121 by changing a voltage applied to the gate electrode 112. Thereby, the vertical FET can be operated by controlling a current passing between the source electrode 111 and the drain electrode 113.

Further, as for the field effect transistors, many documents are known besides Non-Patent Document 1. Especially, various researches have been conducted into field effect transistors using nitride semiconductors from the viewpoint of improvements in element characteristics and the like. For example, Patent Document 1 describes as follows: "To reduce the chip area and achieve a high withstand voltage operation, in a field effect transistor that uses a nitride compound semiconductor." ("Problem to be Solved" in the Abstract of Patent Document 1). Patent Document 2 describes as follows: "To achieve a low resistance buffer layer in an electronic device (power electronics device) operated by passing a current through a SiC substrate and nitride semiconductor layers." ("Problem to be Solved" in the Abstract of Patent Document 2). Patent Document 3 describes as follows: "To provide a nitride semiconductor which has a small resistance of an element and a high operating voltage." ("Problem to be Solved" in the Abstract of Patent Document 3). Patent Document 4 describes as follows: "To provide a semiconductor device that reduces polarization generated by the lamination of semiconductor layers, has a mesa section for enabling a carrier to move smoothly, and has a low electric resistance." ("Problem to be Solved" in the Abstract of Patent Document 4).

RELATED ART DOCUMENT

Patent Document

[Patent Document 1] JP 2007-142243 A
[Patent Document 2] JP 2007-134517 A
[Patent Document 3] JP 2007-59719 A
[Patent Document 4] JP 2006-324279 A Non-Patent Document

[Non-Patent Document 1] H. Otake et al., Japanese Journal of Applied Physics, Vol. 46, No. 25, 2007, pp. L599 to L601

DISCLOSURE OF THE INVENTION

Problem to be Solved by the Invention

The inventors of the present invention focused on the suppression of a punch-through phenomenon in a semiconductor device such as a field effect transistor or the like, and conducted earnest studies. The punch-through phenomenon is a phenomenon in which a lot of substrate currents that cannot be controlled by the gate electrode pass through a semiconductor device provided with a gate electrode. Hereinafter, this will be described with theoretical equations.

FIG. 11B shows an example of the structure of the vertical GaN FET. FIG. 12 is a schematic view of the band energy distribution of the vertical GaN FET shown in FIG. 11B. As shown in FIG. 11B, in this vertical GaN FET, an n-type GaN layer 102, a p-type GaN layer 103, and an n-type GaN layer 104 are laminated on the upper surface of a high concentration n-type GaN substrate 101 in this order. On the lower surface of the high concentration n-type GaN substrate 101, a drain electrode 113 is in ohmic-contact with the high concentration n-type GaN substrate 101. On the upper surface of the n-type GaN layer 104, a source electrode 111 is in ohmic-contact with the n-type GaN layer 104. On the side surfaces of the n-type GaN layer 102, the side surfaces of the p-type GaN layer 103, the upper surface and the side surfaces of the n-type GaN layer 104, except for the area where the source electrode 111 is formed, a gate insulation film 121 is laminated. Parts of the upper part of the n-type GaN layer 102, parts of the p-type GaN layer 103, and parts of the n-type GaN layer 104 are removed. At the removed areas, a gate insulation film 121 is formed so as to cover the upper surface of the n-type GaN layer 102, the side surfaces of the p-type GaN layer 103, and the side surfaces of the n-type GaN layer 104. The gate electrodes 112 are in contact with the n-type GaN layer 102, the p-type GaN layer 103, and the n-type GaN layer 104 via the gate insulation film 121. This vertical GaN FET can control the concentration of electrons accumulated at the interface between the p-type GaN layer 103 and the gate insulation film 121 by changing a voltage applied to the gate electrode 112. Thereby, the vertical FET can be operated by controlling a current passing between the source electrode 111 and drain electrode 113.

The line A-B shown in FIG. 12 corresponds to the line A-B shown in FIG. 11B, i.e., the band energy distribution of the semiconductor layers between the source electrode and the drain electrode. FIG. 12 shows the band energy distribution from the n-type GaN layer 102 to the n-type GaN layer 104 among the semiconductor layers. $V_{ds}$ (V) shown in FIG. 12 indicates a drain voltage. Hereinafter, the thickness of the p-type GaN layer 103 is defined as $L_{ch}$ (cm) and the impurity concentration of the p-type GaN layer 103 is defined as $N_a$ (cm$^{-3}$). The thickness of the n-type GaN layer 102 is defined as $L_{dr}$ (cm) and the impurity concentration of the n-type GaN layer 102 is defined as $N_{d1}$ (cm$^{-3}$). Further, the extensions of the depletion layers (depletion layer widths) in these semiconductor layers from the pn junction surface therebetween are respectively defined as $x_{p1}$ (cm) and $x_{n1}$ (cm). Furthermore, the depletion layer widths in the p-type GaN layer 103 and the n-type GaN layer 104 from the pn junction surface therebetween are respectively defined as $x_{p2}$ (cm) and $x_{n2}$ (cm) and the impurity concentration of the n-type GaN layer 104 is defined as $N_{d2}$ (cm$^{-3}$). The relationship represented by the following Equations (1) and (1B) is given between the depletion layer width and the impurity concentration.

$$x_{p1} \times N_a = x_{n1} \times N_{d1} \quad (1)$$

$$x_{p2} \times N_a = x_{n2} \times N_{d2} \quad (1B)$$

The withstand voltage $V_B$ (V) of the vertical GaN FET shown in FIG. 11B can be designed by adjusting the thickness of the n-type GaN layer 102. That is, when the breakdown electric field of GaN is defined as $E_{crit}$ (V/cm), the following Equation (2) is given under the condition in which the n-type GaN layer 102 is fully-depleted. In Equation (2), the meanings of the symbols are as follows:
$V_{bi}$: built-in-potential (V)
k: Boltzmann constant
T: temperature (K)
q: elementary charge (C)
$\epsilon_s$: permittivity of semiconductor layer (F/cm)

[Equation 2]

$$V_B = \frac{\epsilon_s E_{crit}^2}{2qN_{d1}} - V_{bi} + \frac{kT}{q} \quad (2)$$

The on-resistance $R_{ON}$ (Ω) of the vertical GaN FET shown in FIG. 11B can be approximately expressed by the following Equation (3). In Equation (3), the meanings of the symbols are as follows:
q: elementary charge (C)
n: carrier concentration (cm$^{-3}$)
$\mu_{ch}$: channel mobility (cm$^2$/V·s)
$\mu_n$: mobility in n-type GaN (cm$^2$/V·s)

[Equation 3]

$$R_{on} = \frac{L_{ch}}{qn\mu_{ch}} + \frac{L_{dr}}{qN_{d1}\mu_n} \quad (3)$$

FIG. 13 shows the relationship between the withstand voltage $V_B$ (V) and the on-resistance $R_{ON}A$ (mΩ·cm$^2$) calculated by the relational expression of Equations (2) and (3) in the case where a maximum value of the electric field intensity reaches $E_{crit}$ (V/cm) under the voltage condition in which the n-type GaN layer 102 is fully-depleted. In FIG. 13, the horizontal axis indicates a withstand voltage $V_B$ (V) and the vertical axis indicates an on-resistance $R_{ON}A$ (mΩ·cm$^2$). As shown in FIG. 13, in the region in which the withstand voltage $V_B$ is 1000 (V) or more, by reducing $L_{dr}$, the withstand voltage $V_B$ (V) as well as the on-resistance $R_{ON}A$ (mΩ·cm$^2$) decrease, and the correlation close to the GaN theoretical limit can be seen. On the other hand, in the region in which the withstand voltage $V_B$ is 1000 (V) or less, by reducing $L_{dr}$ (cm), the withstand voltage $V_B$ (V) decreases whereas the on-resistance $R_{ON}A$ (mΩ·cm$^2$) shows a constant value because the resistance of the p-type GaN layer 103 becomes dominant because of the fixed value of $L_{ch}$ (cm).

It is effective to reduce $L_{ch}$ (cm) for decreasing the on-resistance $R_{ON}A$ (mΩ·cm$^2$) in the region in which $V_B$ is 1000 (V) or less. However, when the depletion layer in the p-type GaN layer 103 extends over the entire area thereof, a space-charge limited current passes due to a punch-through phenomenon and the off-state cannot be maintained. Therefore, there is a limit of the reduction of $L_{ch}$.

Conditions for punch-through suppression are as follows. First, the extension of the depletion layer at the pn junction is described in section 2.3 in "S. M. Sze, *Physics of Semiconductor Devices,*" John Wiley & Sons, 2nd edition, 1981". In the FET shown in FIG. 11B, the Poisson equations of the p-type GaN layer 103 and the n-type GaN layer 102 are expressed by the following Equations (4) to (7).

[Equation 4]

$$-\frac{\partial^2 V_p}{\partial^2 x} \approx -\frac{qN_a}{\epsilon_s} \quad (-x_p \leq x < 0) \quad (4)$$

[Equation 5]

$$-\frac{\partial^2 V_n}{\partial^2 x} \approx \frac{qN_{d1}}{\epsilon_s} \quad (0 < x \leq x_{n1}) \quad (5)$$

[Equation 6]

$$E_p(x) = -\frac{qN_a(x + x_{p1})}{\epsilon_s} \quad (-x_p \leq x < 0) \quad (6)$$

[Equation 7]

$$E_n(x) = \frac{qN_{d1}(x - x_{n1})}{\epsilon_s} \quad (0 < x \leq x_{n1}) \quad (7)$$

In Equations (4) to (7), x indicates a coordinate (cm) in the case where an axis is taken in the direction perpendicular to the plane of the substrate (vertical direction) of FET. Here, x at the pn junction interface between the p-type GaN layer 103 and the n-type GaN layer 102 satisfies x=0, x at the p-type layer side satisfies x<0, and x at the n-type layer side satisfies x>0. Further, E(x) indicates the electric field in a coordinate x, $E_n$(x) indicates the electric field in the case where x is present in the n-type GaN layer 102, and $E_p$(x) indicates the electric field in the case where x is present in the p-type GaN layer 103. A maximum value of the electric field $E_{max}$ is given in the electric field satisfying x=0 and is expressed by the following Equation (8).

[Equation 8]

$$|E_{max}| = \frac{qN_a x_{p1}}{\varepsilon_s} = \frac{qN_{d1} x_{n1}}{\varepsilon_s} \quad (8)$$

The following Equations (9) and (10) are given when Equations (6) and (7) are integrated under the following conditions: "$V_p(-x_p)=0$" and "$V_n(x_{n1})=-(V_{bi}+V_{ds})$".

[Equation 9]

$$V_p(x) = -\frac{qN_a}{2\varepsilon_s}x^2 - \frac{qN_a x_{p1}}{\varepsilon_s}x - \frac{qN_a x_{p1}^2}{2\varepsilon_s} \quad (-x_p \leq x < 0) \quad (9)$$

[Equation 10]

$$V_n(x) = \frac{qN_{d1}}{2\varepsilon_s}x^2 - \frac{qN_{d1} x_{n1}}{\varepsilon_s}x + \frac{qN_{d1} x_{n1}^2}{2\varepsilon_s} - V_{bi} - V_{ds} \quad (0 < x \leq x_{n1}) \quad (10)$$

In Equations (9) and (10), the meanings of $V_{bi}$ and $V_{ds}$ are as follows:
$V_{bi}$: built-in-potential (V)
$V_{ds}$: drain voltage of FET (V)
On the basis of Equations (9), (10), and (8), the depletion layer width $|x_{p1}|$ in the p-type layer in the vicinity of the interface between the p-type GaN layer 103 and the n-type GaN layer 102 is expressed by the following Equation (11) because the following equation is satisfied: $V_p(0)=V_n(0)$.

[Equation 11]

$$|x_{p1}| = \sqrt{\frac{2\varepsilon_s(V_{bi}+V_{ds})}{qN_a\left(1+\frac{N_a}{N_{d1}}\right)}} \quad (11)$$

Similarly, the depletion layer width $|x_{p2}|$ in the p-type layer from the pn junction surface between the p-type GaN layer 103 and the n-type GaN layer 104 is expressed by the following Equation (12).

[Equation 12]

$$|x_{p2}| = \sqrt{\frac{2\varepsilon_s V_{bi}}{qN_a\left(1+\frac{N_a}{N_{d2}}\right)}} \quad (12)$$

From the above, the condition for not causing a punch-through at the time of application of a drain voltage $V_{ds}$ is expressed by the following Equation (13).

[Equation 13]

$$L_{ch} > |x_{p1}|+|x_{p2}| = \sqrt{\frac{2\varepsilon_s(V_{bi}+V_{ds})}{qN_a\left(1+\frac{N_a}{N_{d1}}\right)}} + \sqrt{\frac{2\varepsilon_s V_{bi}}{qN_a\left(1+\frac{N_a}{N_{d2}}\right)}} \quad (13)$$

That is, in the case where the on-resistance $R_{ON}$ of the device is decreased with the semiconductor structure shown in FIG. 11B, in a low withstand voltage region in which $V_B$ is 1000 (V) or less, there is a limit of the decrease in on-resistance by reducing the thickness of the p-type GaN layer 103 due to an occurrence of a punch-through phenomenon. From these facts, there is a need for developing semiconductor devices capable of suppressing the occurrence of the punch-through phenomenon.

Hence, the present invention is intended to provide a semiconductor device capable of suppressing an occurrence of a punch-through phenomenon.

Means for Solving Problem

In order to achieve the aforementioned object, the semiconductor device of the present invention includes:
a substrate;
a first n-type semiconductor layer;
a p-type semiconductor layer;
a second n-type semiconductor layer;
a drain electrode;
a source electrode;
a gate electrode; and
a gate insulation film, wherein
the first n-type semiconductor layer, the p-type semiconductor layer, and the second n-type semiconductor layer are laminated at an upper side of the substrate in this order,
the drain electrode is in ohmic-contact with the first n-type semiconductor layer,
the source electrode is in ohmic-contact with the second n-type semiconductor layer,
an opening portion to be filled or a notched portion that extends from an upper surface of the second n-type semiconductor layer to an upper part of the first n-type semiconductor layer is formed at a part of the p-type semiconductor layer and a part of the second n-type semiconductor layer,
the gate insulation film is formed so as to cover the opening portion to be filled or the notched portion,
the gate electrode is arranged so as to fill the opening portion to be filled or the notched portion via the gate insulation film and is in contact with an upper surface of the first n-type semiconductor layer, side surfaces of the p-type semiconductor layer, and side surfaces of the second n-type semiconductor layer at inner surfaces of the opening portion to be filled or at a surface of the notched portion via the gate insulation film, and
the p-type semiconductor layer has a positive polarization charge at a first n-type semiconductor layer side in a state where a voltage is applied to none of the drain electrode, the source electrode, and the gate electrode.

Further, the electronic device of the present invention includes the semiconductor device of the present invention.

Effects of the Invention

According to the present invention, a semiconductor device capable of suppressing an occurrence of a punch-through phenomenon can be provided.

DESCRIPTION OF EMBODIMENTS

Hereinafter, the semiconductor device of the present invention will be described in further detail based on the specific embodiments. Note here that the following embodiments are merely illustrative, and the present invention is not limited thereto. For example, in the present invention, the aforementioned and following equations are mere theoretical equations and phenomena actually caused in the semiconductor devices of the present invention may not fully agree with the equations. Further, since the views showing the structures of the semiconductor devices are illustrative schematic views for convenience of explanation, dimensional ratios of components, structures of details of the devices, and the like may be different from those of actual semiconductor devices. In the present invention, the case where the invention is specified by numerical limitations, it may be strictly specified by numerical values or may be roughly specified by numerical values.

Embodiment 1

<Structure of Semiconductor Device>

Figure 1:
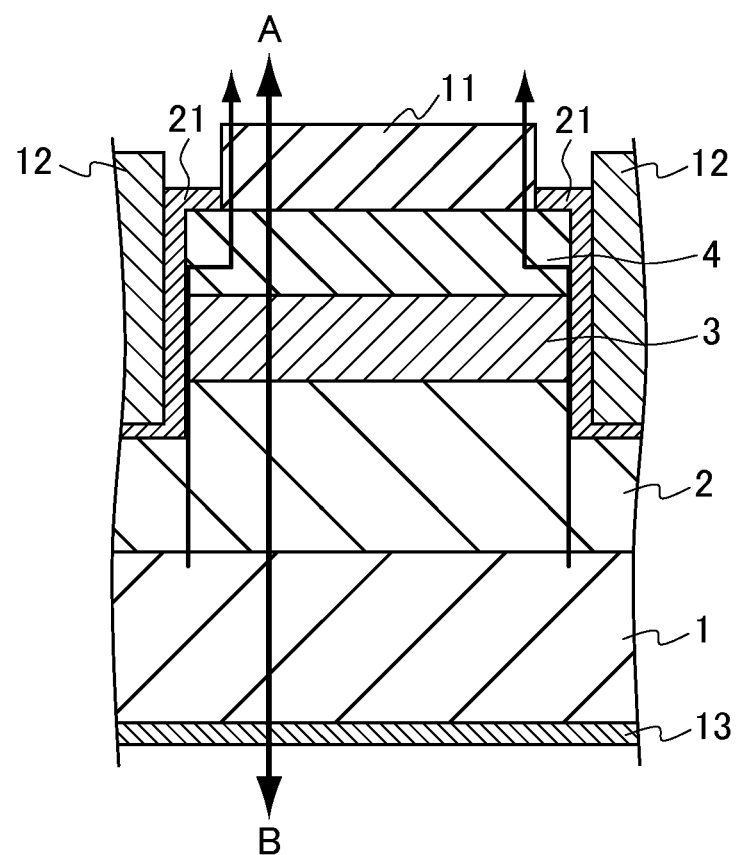
FIG. 1 is a cross sectional view showing the structure of the semiconductor device in an embodiment of the present invention.

FIG. 1 is a cross sectional view showing the structure of the semiconductor device in an embodiment of the present invention. The semiconductor device of the present embodiment is a vertical GaN FET. FIG. 1 schematically shows the semiconductor structure of the vertical GaN FET in the present embodiment.

As shown in FIG. 1, the vertical GaN FET of the present embodiment includes an n-type substrate 1 formed of Si or the like, an n-type GaN layer (n-type GaN drift layer) 2, a p-type InGaN layer (p-type InGaN channel layer) 3, an n-type GaN layer 4 (n-type InGaN cap layer), a drain electrode 13, a source electrode 11, and a gate electrode 12. The n-type GaN layer 2 corresponds to the "first n-type semiconductor layer" in the semiconductor device of the present invention. The p-type InGaN layer 3 corresponds to the "p-type semiconductor layer" in the semiconductor device of the present invention. The n-type GaN layer 4 corresponds to the "second n-type semiconductor layer" in the semiconductor device of the present invention. Further, the vertical GaN FET of the present embodiment further includes a gate insulation film 21.

The n-type GaN layer 2 (first n-type semiconductor layer), the p-type InGaN layer 3 (p-type semiconductor layer), and the n-type GaN layer 4 (second n-type semiconductor layer) each grown on a Ga-face are laminated on the upper surface of the n-type substrate 1 in this order. The upper surface of the n-type GaN layer 2 is in contact with the lower surface of the p-type InGaN layer 3. The upper surface of the p-type InGaN layer 3 is in contact with the lower surface of the n-type GaN layer 4. The drain electrode 13 is formed on the lower surface of the n-type substrate 1 and is in ohmic-contact with the n-type GaN layer 2 (first n-type semiconductor layer). The source electrode 11 is formed on the upper surface of the n-type GaN layer 4 (second n-type semiconductor layer) and is in ohmic-contact with the n-type GaN layer 4. Parts of the upper part of the n-type GaN layer 2, parts of the p-type InGaN layer 3, and parts of the n-type GaN layer 4 are removed. The gate insulation films 21 are formed so as to cover the removed areas. The gate electrodes 12 are arranged so as to fill the removed areas and are in contact with the upper surface of the n-type GaN layer 2 (first n-type semiconductor layer), the side surfaces of the p-type InGaN layer 3 (p-type semiconductor layer), and the side surfaces of the n-type GaN layer 4 (second n-type semiconductor layer) at the surfaces of the removed areas via the gate insulation film 21. The p-type InGaN layer 3 (p-type semiconductor layer) has a positive polarization charge at the n-type GaN layer 2 (first n-type semiconductor layer) side in the state where a voltage is applied to none of the drain electrode 13, the source electrode 11, and the gate electrode 12. In FIG. 1, the arrows between A and B indicate the direction perpendicular to the plane of the substrate 1 from the upper side of the source electrode 11 toward the lower side of the drain electrode 13. The arrows other than these are arrows for schematically illustrating the direction of a current.

In the vertical GaN FET of the present embodiment, the structure shown in FIG. 1 is provided in plurality and the structures are formed continuously from side to side. That is, although FIG. 1 shows as if the source electrode 11 is formed at the center of the upper part of the vertical GaN FET and the gate electrodes 12 are formed at the right and left sides, the gate insulation film 21 and the gate electrode 12 each connect with the other half to form one gate insulation film and one gate electrode. In other words, an opening portion to be filled is formed by removing a part of the upper part of the n-type GaN layer 2, a part of the p-type InGaN layer 3, and a part of the n-type GaN layer 4, and the gate insulation film 21 is formed so as to cover the opening portion to be filled. The gate electrode 12 is arranged so as to fill the opening portion to be filled via the gate insulation film 21 and is in contact with the upper surface of the n-type GaN layer 2 (first n-type semiconductor layer), the side surfaces of the p-type InGaN layer 3 (p-type semiconductor layer), and the side surfaces of the n-type GaN layer 4 (second n-type semiconductor layer) at the inner surfaces of the opening portion to be filled via the gate insulation film 21. In other words, in the present embodiment, the gate electrode 12 and the source electrode 11 are arranged alternately in a plane at the upper part of the vertical GaN FET.

In the present invention, "contact" may represent the state in which components are directly in contact with each other or the state in which components are in contact with each other via other component(s). The state in which an electrode is in contact with a semiconductor layer include, for example as explained with reference to FIG. 1, the state in which the source electrode 11 is directly in contact with the n-type GaN layer 4, the state in which the drain electrode 13 is in contact with the n-type GaN layer 2 via the n-type substrate 1, the state in which the gate electrode 12 is in contact with the n-type GaN layer 2, the p-type InGaN layer 3, and the n-type GaN layer 4 via the insulation film 21.

Note here that in the present invention, unless otherwise noted, "at the upper side" is not limited to the state where a first component is directly in contact with the upper surface of a second component (on) but may include the state where another component is present between two components, i.e., the state where the first component is not directly in contact with the upper surface of the second component (above). Similarly, unless otherwise noted, "at the lower side" may include the state where a first component is directly in contact with the lower surface of a second component (on) or the state where another component is present between two components, i.e., the state where the first component is not directly in contact with the lower surface of the second component (below). Further, "on the upper surface" indicates the state where a first component is directly in contact with the upper surface of a second component. Similarly, "on the lower surface" indicates the state where a first component is directly in contact with the lower surface of a second component. Unless otherwise noted, "at the one side" may include the state where a first component is directly in contact with the one side of a second component or the state where another component is present between two components, i.e., the state where the first component is not directly in contact with the one side of the second component. The same applies to "at the both sides". "On the one side" indicates the state where a first component is directly in contact with the one side of a second component. The same applies to "on the both sides".

Further, in the present invention, the "composition" refers to a quantitative relationship between the number of atoms of an element configuring a semiconductor layer and the like. The "composition ratio" refers to a relative ratio between the number of atoms of a specific element configuring the semiconductor layer and the like and the number of atoms of the other element configuring the same. For example, in the semiconductor layer represented by the composition of $Al_xGa_{1-x}N$, a value of x is referred to as an "Al composition ratio". In the present invention, in the case where the composition of a semiconductor layer is compared with that of another semiconductor, impurity (dopant) for expressing conductivity is not considered as an element configuring a semiconductor layer. For example, although an impurity (dopant) in a p-type GaN layer and that in an n-type GaN layer are different from each other, the composition of the p-type GaN layer and that of the n-type GaN layer are regarded as identical to each other. In the case where an n-type GaN layer and an $n^+$GaN layer with a higher impurity concentration are present, the composition of the n-type GaN layer and that of the $n^+$GaN layer are regarded as identical to each other.

Further, semiconductors are present in a crystalline state or an amorphous (noncrystalline) state. In the semiconductor device of the present invention, each of the semiconductors respectively configuring the first n-type semiconductor layer, the p-type semiconductor layer, the second n-type semiconductor layer, and the like is preferably in the crystalline state, although it is not particularly limited. Further, more preferably, the crystalline state is a single crystalline state, although it can be a single crystalline state or a polycrystalline state.

<Production Method of Semiconductor Device>

The method of producing a vertical GaN FET, which is the semiconductor device of the present embodiment shown in FIG. 1, will be described.

First, the aforementioned semiconductor layers are formed, for example, by the molecular beam epitaxy (MBE) growth method at the upper side of the n-type substrate 1 formed of conductive Si. Specifically, the n-type GaN drift layer 2 (thickness: 1 μm and doping concentration: $1 \times 10^{17}$ cm$^{-3}$), the p-type $In_{0.2}Ga_{0.8}N$ channel layer 3 (thickness: 0.1 μm and doping concentration: $5 \times 10^{17}$ cm$^{-3}$), and the n-type GaN cap layer 4 (thickness: 0.1 μm and doping concentration: $5 \times 10^{17}$ cm$^{-3}$) are laminated in this order from the n-type substrate 1 side.

Next, the source electrode 11 and the drain electrode 13 are formed, for example, by vapor deposition of metal such as Ti/Al, on the upper surface of the n-type GaN layer 4 and the lower surface of the n-type substrate 1 respectively. After formation, the source electrode 11 and the drain electrode 13 are respectively brought into ohmic-contact with the n-type GaN layer 4 and the n-type GaN drift layer 2 via the n-type substrate 1 by annealing at 650° C.

Then, parts of the epitaxial layer structure formed of the layers 2, 3, and 4 are removed by etching until the n-type GaN drift layer 2 is exposed. On the surface of the removed areas, for example, $Al_2O_3$ is formed as the gate insulation films 21 and then the gate electrodes 12 are formed by vapor deposition of metal such as Ni/Au, for example. In this manner, the vertical GaN FET shown in FIG. 1 can be produced.

Note here that the above description is merely illustrative and the vertical GaN FET shown in FIG. 1 may be produced by a method other than this. The method of producing the semiconductor device of the present invention is not particularly limited and any method can be applied with reference to methods of producing a semiconductor device in general, for example.

<Operation, Effect, Variation, and the Like>

Hereinafter, operations, effects, variations, and the like of the semiconductor device of the present embodiment shown in FIG. 1 will be illustrated.

Figure 2:
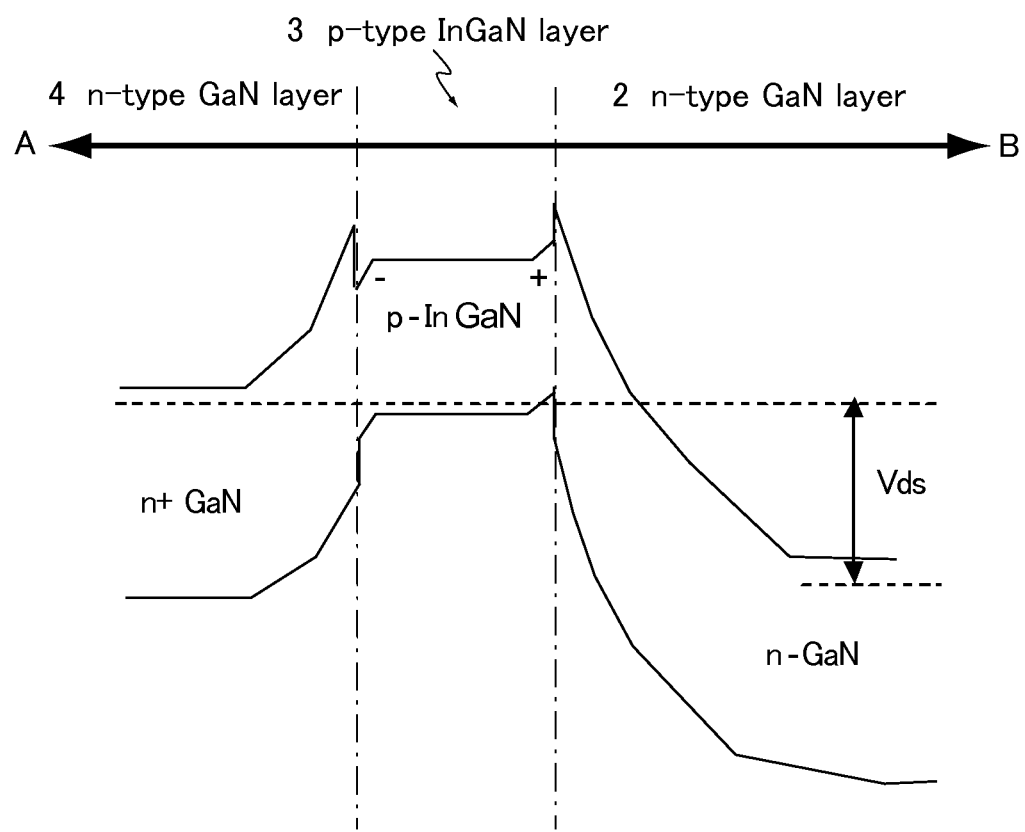
FIG. 2 is a view illustrating the band energy distribution of the semiconductor device shown in FIG. 1.

First, the band energy distribution of the vertical GaN FET of the present embodiment shown in FIG. 1 will be described. FIG. 2 is a schematic view illustrating the band energy distribution of the vertical GaN FET of the present embodiment. The line A-B shown in FIG. 2 corresponds to the line A-B shown in FIG. 1, i.e., the band energy distribution of the semiconductor layers between the source electrode and the drain electrode. FIG. 2 shows the band energy distribution from the n-type GaN layer 2 to the n-type GaN layer 4 among the semiconductor layers. $V_{ds}$ shown in FIG. 2 indicates a drain voltage (V) of the vertical GaN FET shown in FIG. 1 and $V_{bi}$ indicates a built-in-potential (V) of the vertical GaN FET shown in FIG. 1. In the vertical GaN FET of the present embodiment, since the p-type InGaN layer 3 is formed at the upper side of the n-type GaN layer 2, a positive (+) polarization charge is generated at the interface at the lower side of the p-type InGaN layer 3 and a negative (−) polarization charge is generated at the interface at the upper side of the p-type InGaN layer 3 in the state where a voltage is applied to none of the drain electrode 13, the source electrode 11, and the gate electrode 12. Thereby, as shown in FIG. 2, the extension (expansion) of the depletion layer in the p-type InGaN layer 3 at the lower side (n-type GaN layer 2 side) can be suppressed and a punch-through resistance can be increased.

Hereinafter, the design of the polarization charge density will be described. First, according to O. Ambacher, et al., "*Pyroelectric properties of Al(In)GaN/GaN hetero- and quantum well structures,*" *Journal of Physics: Condensed Matter, Vol.* 14, pp. 3399 to 3434 (2002), a spontaneous polarization $P_{sp}$ (C·m$^{-2}$) of $In_yGa_{1-y}N$ (provided that y satisfies the following equation: 0<y≤1), a spontaneous polarization $P_{sp}$ (C·m$^{-2}$) of GaN, and a piezoelectric polarization $P_{pz}$ (C·m$^{-2}$) generated in In$_y$Ga$_{1-y}$N at the upper side of GaN are expressed by the following Equations (14) to (16). $P_{sp}$ (GaN) indicates a spontaneous polarization $P_{sp}$ of a GaN layer and $P_{sp}$ (In$_y$Ga$_{1-y}$N) indicates a spontaneous polarization $P_{sp}$ of an In$_y$Ga$_{1-y}$N layer.

$$P_{sp}(GaN) = -0.031 \quad (14)$$

$$P_{sp}(In_yGa_{1-y}N) = -0.042y - 0.034(1-y) + 0.037y(1-y) \quad (15)$$

$$P_{pz}(In_yGa_{1-y}N/GaN) = 0.148y - 0.0424y(1-y) \quad (16)$$

Further, an interface charge $P_{sp}$ (In$_y$Ga$_{1-y}$N/GaN)(C·m$^{-2}$) originated from a spontaneous polarization in this structure can be derived according to the following Equation (17) based on Equations (14) and (15).

$$P_{sp}(In_yGa_{1-y}N/GaN) = P_{sp}(In_yGa_{1-y}N) - P_{sp}(GaN) = -0.003 + 0.029y - 0.037y^2 \quad (17)$$

That is, a polarization charge σ (C·m$^{-2}$) generated at the interface at the lower side of the p-type InGaN layer 3 can be derived according to the following Equation (18) based on Equations (16) and (17).

$$\sigma(In_{1-y}Ga_yN/GaN) = P_{pz}(In_yGa_{1-y}N/GaN) + P_{sp}(In_yGa_{1-y}N/GaN) = -0.003 + 0.1346y + 0.0054y^2 \quad (18)$$

Figure 3:
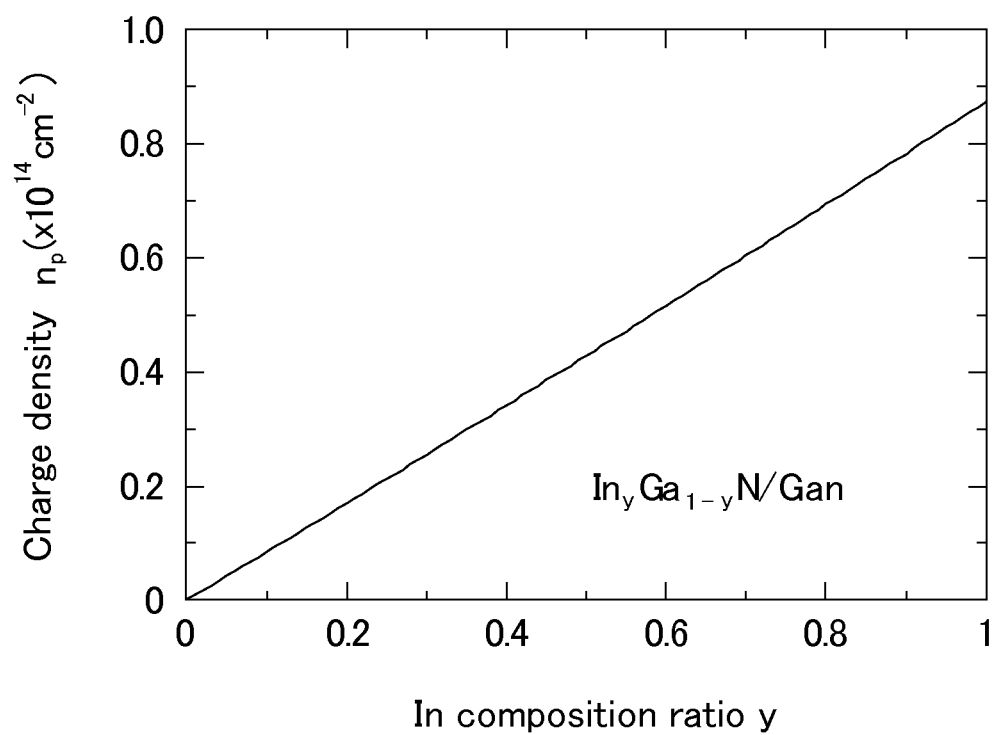
FIG. 3 is a graph illustrating the relationship between the In composition ratio x and the charge density np.

FIG. 3 is a graph showing the relationship between the In composition ratio y and the charge density $n_p$ expressed by Equation (18). In other words, FIG. 3 is a graph illustrating the charge density design by the piezoelectric polarization and the spontaneous polarization in the semiconductor device of the present invention.

According to Equation (18), for generating a positive polarization charge at the interface at the lower side of the p-type InGaN layer 3, y should satisfy the following equation: y>0.022. Further, according to Equation (18), a polarization charge having the same density as and the opposite polarity from Equation (18) is generated at the interface at the upper side of the p-type InGaN layer 3. Note here that Equation (18) is a theoretical equation as described above. Therefore, an actual phenomenon in the semiconductor device of the present invention not always fully agrees with Equation (18). In the semiconductor device of the present invention, if the p-type semiconductor layer actually has a positive polarization charge at the first n-type semiconductor layer side in the state where a voltage is applied to none of the drain electrode, the source electrode, and the gate electrode, y may not satisfy the following equation: y>0.022.

In the semiconductor device of the present invention, the thickness of the p-type semiconductor layer is not particularly limited. However, the thickness of the p-type semiconductor layer is preferably as small as possible from the viewpoint of the decrease in on-resistance and the thickness of the p-type semiconductor layer is preferably more than a certain thickness from the viewpoint of the suppression of occurrence of a punch-through phenomenon. As described above, in the semiconductor device of the present invention, the p-type semiconductor layer has a positive polarization charge at the first n-type semiconductor layer side in the state where a voltage is applied to none of the drain electrode, the source electrode, and the gate electrode. Thereby, since an occurrence of a punch-through phenomenon can be suppressed even when the thickness of the p-type semiconductor layer is small, compatibility between the decrease in on-resistance and the suppression of occurrence of a punch-through phenomenon can be achieved.

Figure 11A:
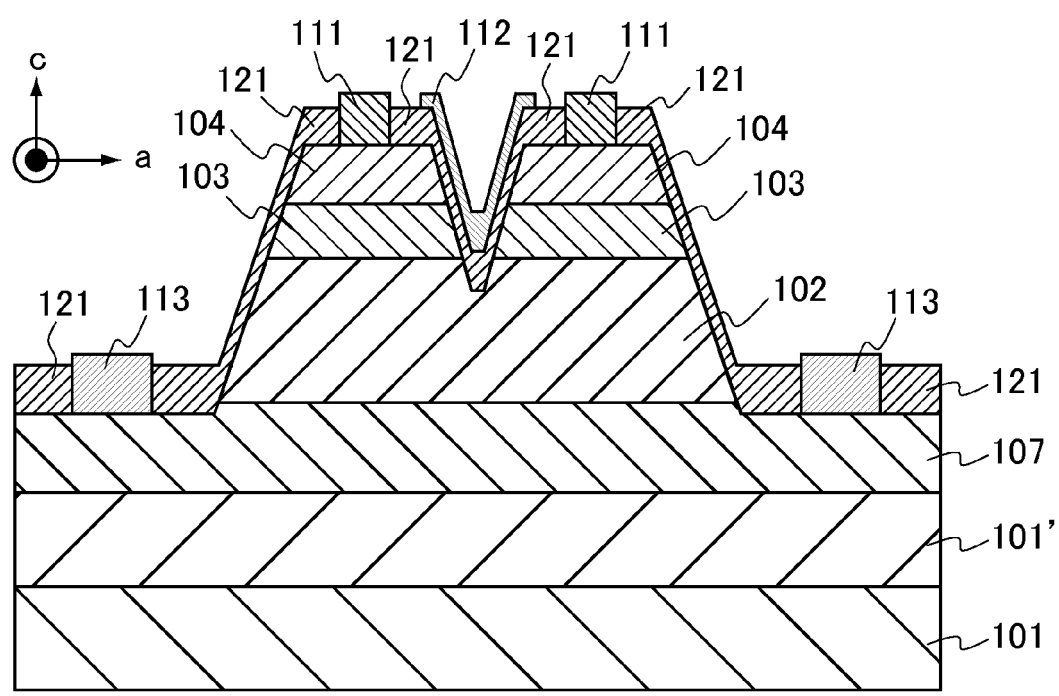
FIG. 11A is a cross sectional view showing an example of the structure of a semiconductor device related to the present invention.
Figure 11B:
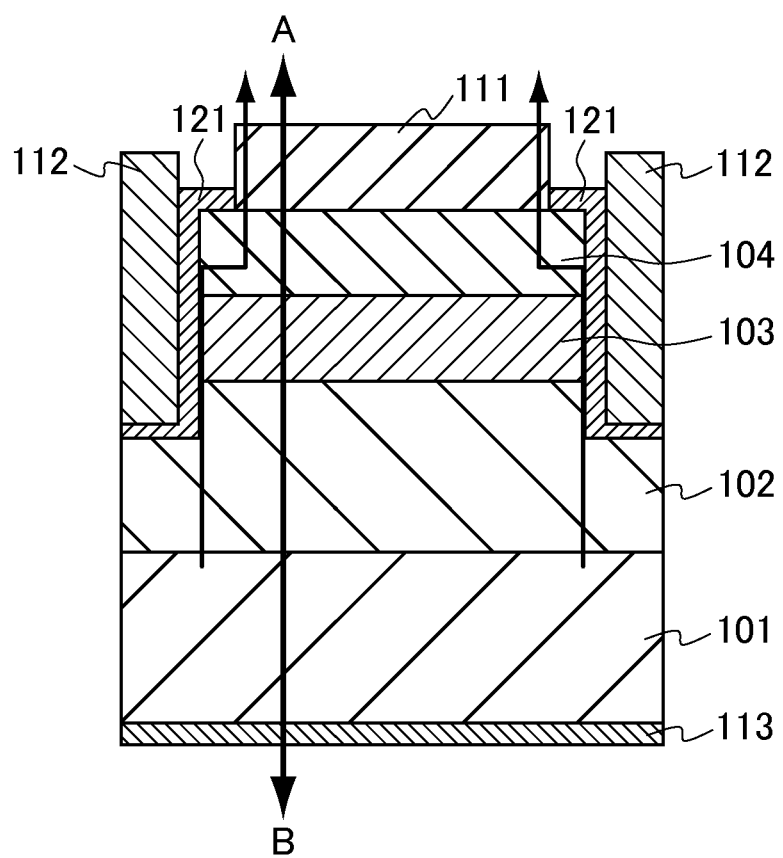
FIG. 11B is a cross sectional view showing another example of the structure of a semiconductor device related to the present invention.
Figure 12:
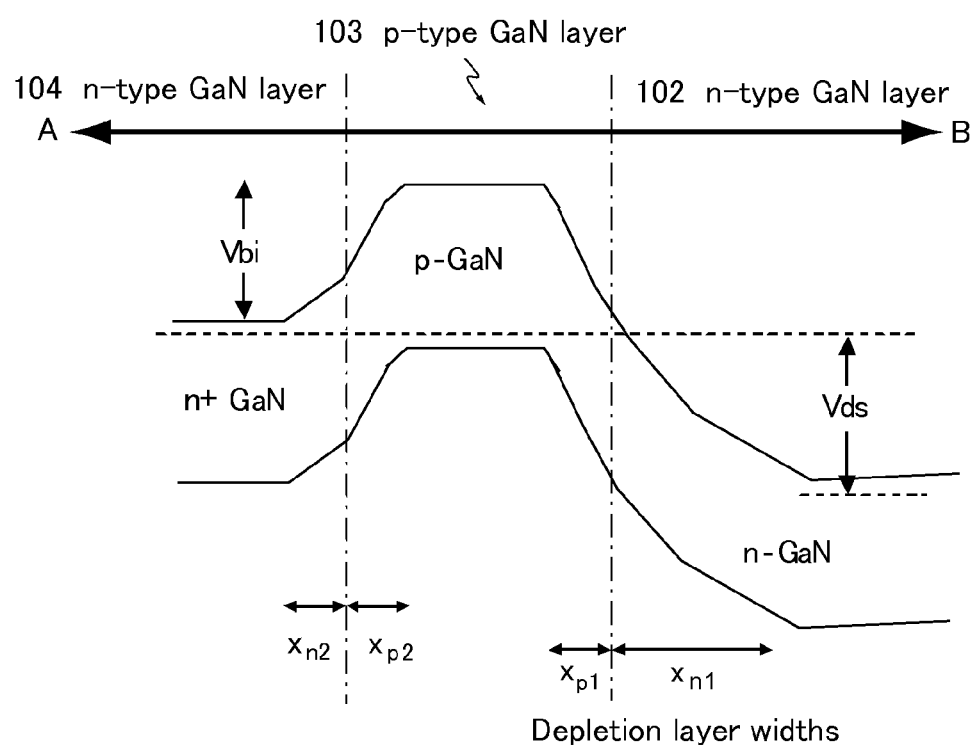
FIG. 12 is a view illustrating the band energy distribution of the semiconductor device shown in FIG. 11B.
Figure 13:
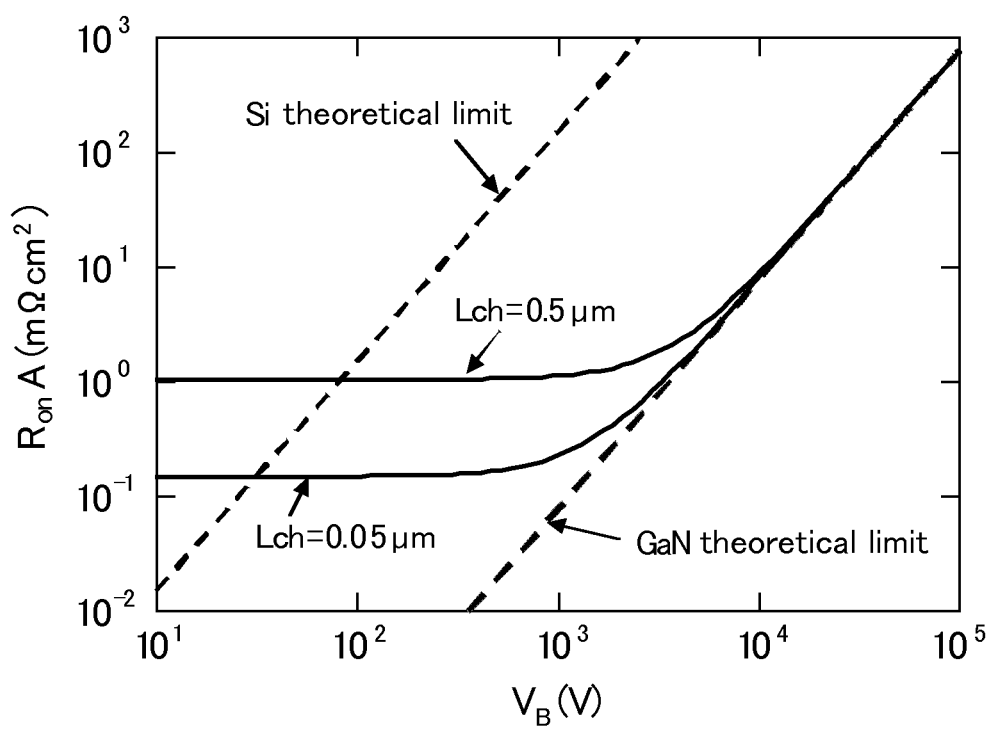
FIG. 13 is a view illustrating a prediction of the relationship between the withstand voltage $V_B$ and the on-resistance $R_{ON}A$ of the vertical GaN FET by a theoretical calculation.

For example, in the vertical GaN FET of the present embodiment shown in FIG. 1, band energy is increased due to a polarization charge generated in the p-type InGaN layer 3 and the expansion of the depletion layer due to application of a drain voltage can be suppressed. Therefore, for example, the reduction of the thickness of the p-type InGaN layer 3 can be achieved in the state where an occurrence of a punch-through phenomenon is suppressed. Thereby, for example, the vertical GaN FET of the present embodiment can make the thickness of the p-type InGaN layer 3 smaller than that of the semiconductor device related to the present invention shown in FIG. 11A or FIG. 11B, and the decrease in on-resistance can be achieved. Further, since the vertical GaN FET of the present embodiment employs the p-type InGaN layer 3 in which In is added to a p-type layer, the concentration of p-type dopant (impurity) can be increased. Therefore, the reduction of the thickness of the p-type InGaN layer 3 can be achieved in the state where an occurrence of a punch-through phenomenon is suppressed and the decrease in on-resistance can be achieved.

Further, in the semiconductor device of the present invention, the thickness of the p-type semiconductor layer preferably satisfies the following Equation (A) from the viewpoint of the suppression of occurrence of a punch-through phenomenon. Note here that the following Equation (A) is the same as Equation (13).

[Equation 14]

$$L_{ch} > \sqrt{\frac{2\varepsilon_s(V_{bi}+V_B)}{qN_a\left(1+\frac{N_a}{N_{d1}}\right)}} + \sqrt{\frac{2\varepsilon_s V_{bi}}{qN_a\left(1+\frac{N_a}{N_{d2}}\right)}} \quad (A)$$

In Equation (A), the meanings of the symbols are as follows:
$N_{d1}$: impurity concentration of first n-type semiconductor layer (cm$^{-3}$)
$N_{d2}$: impurity concentration of second n-type semiconductor layer (cm$^{-3}$)
$N_a$: impurity concentration of p-type semiconductor layer (cm$^{-3}$)
$L_{ch}$: thickness of p-type semiconductor layer (cm)
q: elementary charge (elementary electric charge) (C)
$\varepsilon_s$: permittivity of semiconductor layer (F/cm)
$V_{bi}$: built-in-potential (V)
$V_B$: withstand voltage of semiconductor device (V)

Figure 4:
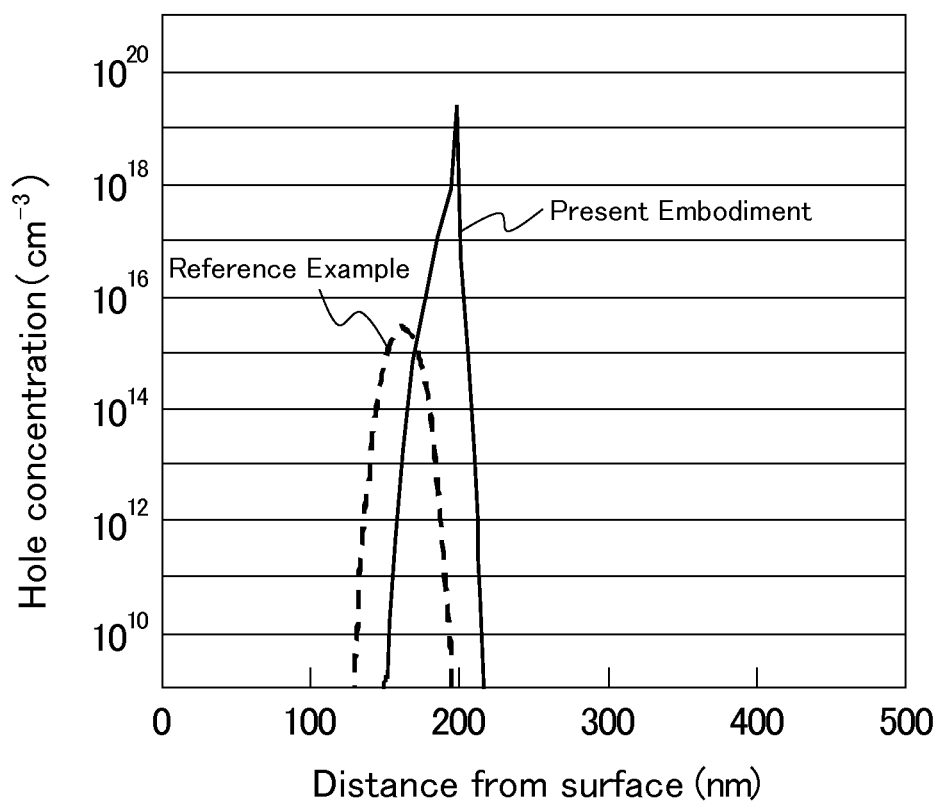
FIG. 4 is a graph illustrating the hole concentration distribution in the p-type layer of the semiconductor device.

FIG. 4 shows the distribution of the hole concentration of the semiconductor device of the present embodiment (FIG. 1) and the distribution of the hole concentration of a semiconductor device produced as a reference example. As for the reference example, a semiconductor device having the structure shown in FIG. 11B was produced in the same manner as described above. The semiconductor structure of the semiconductor device of this reference example was as follows: an n-type GaN drift layer 102 (thickness: 1 μm and doping concentration: 1×10$^{17}$ cm$^{-3}$), a p-type GaN channel layer 103 (thickness: 0.1 μm and doping concentration: 5×10$^{17}$ cm$^{-3}$), and an n-type GaN cap layer 104 (thickness: 0.1 μm and doping concentration: 5×10$^{17}$ cm$^{-3}$) are formed in this order from an n-type substrate 101 side in FIG. 11B. As shown in FIG. 4, since the hole concentration in the p-type semiconductor layer (p-type GaN channel layer 103) is lower than the doping concentration (5×10$^{17}$ cm$^{-3}$), a neutral region is lost (i.e., the entire p layer is depleted) and the semiconductor device of the reference example is in the state ready for a punch-through. In contrast, in the semiconductor device of the present embodiment, a region not depleted remains, and therefore the punch-through is suppressed.

In the present invention, the first n-type semiconductor layer, the p-type semiconductor layer, and the second n-type semiconductor layer are each preferably formed of a III-V-nitride semiconductor, although it is not particularly limited. The III-V-nitride semiconductor is preferably a III-nitride semiconductor that does not contain a group V element other than nitrogen, although the III-V-nitride semiconductor can be a mixed crystal that contains a group V element other than nitrogen such as GaAsN or the like. Examples of the III-nitride semiconductor include GaN, InGaN, AlGaN, InAlN, and InAlGaN. Further, the III-V-nitride semiconductor is more preferably a III-V-nitride semiconductor grown on a Ga-face growth.

In the semiconductor device of the present invention, the configuration of the p-type semiconductor layer having a positive polarization charge at the first n-type semiconductor layer side in the state where a voltage is applied to none of the drain electrode, the source electrode, and the gate electrode is not particularly limited. Preferably, the composition of the p-type layer is different from that of the first n-type semiconductor layer for allowing the p-type semiconductor layer to have a positive polarization charge. For example, the difference between the distance between atoms in the crystal lattice of the p-type semiconductor layer and that of the first n-type semiconductor layer causes a distortion in the crystal structure of the p-type semiconductor layer and makes it possible to generate a positive polarization charge. A phenomenon in which a polarization charge is generated in the semiconductor due to an external stress or a distortion applied to a semiconductor in this manner is called a "piezoelectric effect" or a "piezoelectric polarization". In the semiconductor device of the present invention, more preferably, the first n-type semiconductor layer has composition represented by $Al_xGa_{1-x}N$ (provided that x satisfies the following equation: $0 \leq x \leq 1$) and the p-type semiconductor layer has composition represented by $In_yGa_{1-y}N$ (provided that y satisfies the following equation: $0 < y \leq 1$). When the first n-type semiconductor layer and the p-type semiconductor layer have the aforementioned composition, the piezoelectric effect (piezoelectric polarization) can be obtained more effectively. In the first n-type semiconductor layer, the Al composition ratio x is preferably from 0 to 0.5, more preferably from 0.05 to 0.4, and particularly preferably from 0.1 to 0.3. Note here that the vertical GaN FET shown in FIG. 1 is an example in which the first n-type semiconductor layer is formed of GaN (n-type GaN layer 2), i.e., an example in which x satisfies the following equation: x=0. Further, in this case, the In composition ratio y of the p-type semiconductor layer represented by $In_yGa_{1-y}N$ (provided that y satisfies the following equation: $0 < y \leq 1$) is preferably more than 0.022 for the aforementioned reasons.

Note that, in the semiconductor device of the present invention, the composition of the p-type semiconductor layer can be the same as the composition of the first n-type semiconductor layer as long as the p-type semiconductor layer has a positive polarization charge at the first n-type semiconductor layer side in the state where a voltage is applied to none of the drain electrode, the source electrode, and the gate electrode. Further, in the semiconductor device of the present invention, the p-type semiconductor layer preferably contains In. For example, in the case where the p-type semiconductor layer is formed of GaN and does not contain In, it is difficult that the p-type dopant (impurity) concentration exceeds $1 \times 10^{17}$ cm$^{-3}$. In contrast, in the case where the p-type semiconductor layer contains In, as described above, the p-type dopant (impurity) can be doped easily in the p-type semiconductor layer at a high concentration. When the concentration of the p-type dopant (impurity) in the p-type semiconductor layer is high, as can be seen from Equation (A) (Equation (13)), a punch-through phenomenon can easily be suppressed even when the thickness of the p-type semiconductor layer is further small. Thereby, compatibility between the suppression of a punch-through phenomenon and the decrease in on-resistance can be achieved more easily. The impurity concentration $N_a$ (cm$^{-3}$) of the p-type semiconductor layer is, for example, $1 \times 10^{16}$ to $1 \times 10^{21}$ cm$^{-3}$, preferably $1 \times 10^{17}$ to $1 \times 10^{20}$ cm$^{-3}$, and particularly preferably $1 \times 10^{18}$ to $1 \times 10^{19}$ cm$^{-3}$. Note here that, as can be seen from Equation (A) (Equation (13)), a preferable range of $N_a$ is influenced by other conditions such as the impurity concentration $N_{d1}$ (cm$^{-3}$) of the first n-type semiconductor layer, the impurity concentration $N_{d2}$ (cm$^{-3}$) of the second n-type semiconductor layer, and the like. The value of $N_a$ can be decided appropriately based on Equation (A) (Equation (13)). Further, for example, as explained with reference to FIG. 4, although $N_a$ of the semiconductor device of the present embodiment is the same as $N_a$ of the semiconductor device of the reference example, a punch-through phenomenon is suppressed in the present embodiment by the effect of the positive polarization charge of the present invention.

In the semiconductor device of the present invention, the p-type semiconductor layer preferably has a negative polarization charge at the second n-type semiconductor layer side in the state where a voltage is applied to none of the drain electrode, the source electrode, and the gate electrode. Thereby, for example, as shown in FIG. 2, the extension (expansion) of the depletion layer in the p-type semiconductor layer at the upper side (the second semiconductor layer side) can be suppressed. From this point of view, for the same reasons as those described for the positive polarization charge, the composition of the p-type semiconductor layer is preferably different from that of the second n-type semiconductor layer. More specifically, for example, the p-type semiconductor layer preferably has composition represented by $In_yGa_{1-y}N$ (provided that y satisfies the following equation: $0 < y \leq 1$) and the n-type semiconductor layer preferably has composition represented by $Al_zGa_{1-z}N$ (provided that z satisfies the following equation: $0 \leq z \leq 1$). In the second n-type semiconductor layer, the Al composition ratio z is preferably from 0 to 0.5, more preferably from 0.05 to 0.4, and particularly preferably from 0.1 to 0.3. However, in the present invention, the composition of the p-type semiconductor layer can be the same as that of the second n-type semiconductor layer.

In the case where the p-type semiconductor layer of the semiconductor device of the present invention has a polarization charge at the first n-type semiconductor layer side, the "first n-type semiconductor layer side" refers to the vicinity of the interface between the p-type semiconductor layer and the first semiconductor layer, although it is not particularly limited.

Further, the semiconductor device shown in FIG. 1 allows every kind of variations. For example, although the present embodiment shows an embodiment in which more than one structure shown in FIG. 1 is formed continuously from side to side, the structure shown in FIG. 1 alone can be worked as a semiconductor device (FET). That is, the semiconductor device (FET) shown in FIG. 1 may include a notched portion in place of the opening portion to be filled, may include the gate insulation film formed so as to cover the surface of the notched portion, and may include the gate electrode arranged so as to fill the notched portion via the gate insulation film. The same applies to FIGS. 5, 6, 7, 8, and 9. Further, the present invention is not limited thereto and the number of each of the drain electrode, the source electrode, and the gate electrode may be one or more than one. The semiconductor device of the present invention can be worked as a semiconductor device as long as it includes at least one each of the drain electrode, the source electrode, and the gate electrode. However, in the semiconductor device of the present invention, preferably, at least one of the source electrode and the gate electrode is provided more than one and the source electrode and the gate electrode are arranged alternately.

Figure 5:
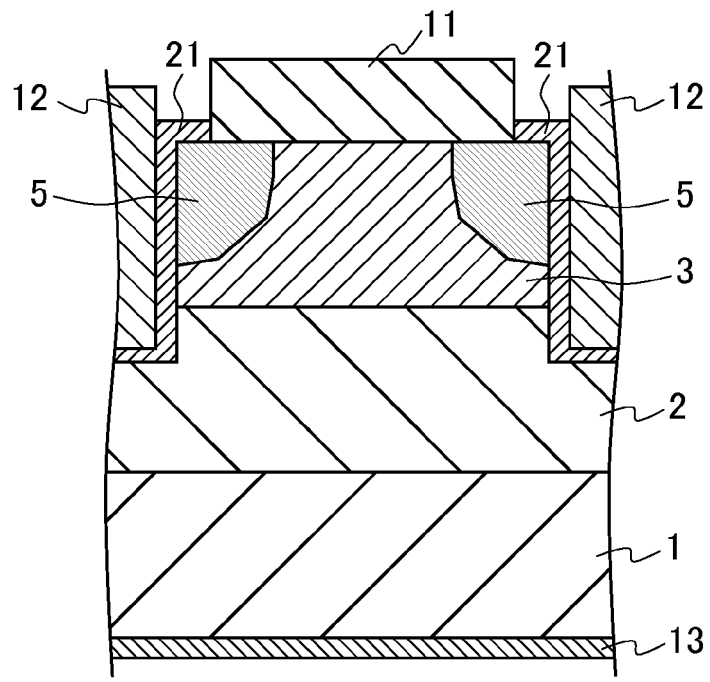
FIG. 5 is a cross sectional view showing a variation of the semiconductor device shown in FIG. 1.

The contact states and the like of the ohmic electrodes (the source electrode and the drain electrode) are not limited to those shown in FIG. 1 and various variations can be employed. For example, in place of the second semiconductor layer described above, an n-type conductive region may be formed by implanting ions to a part of or the whole of the upper part of the p-type semiconductor layer and this n-type conductive region may be served as the second n-type semiconductor layer. An example thereof is shown in FIG. 5. In the semiconductor device (vertical GaN FET) shown in FIG. 5, n-type conductive regions 5 are formed at the right and left sides of the upper part of the p-type InGaN layer 3 by ion implantation. At the center of the upper part of the p-type InGaN layer 3, the n-type conductive region 5 is not formed. The semiconductor device shown in FIG. 5 does not include the second semiconductor layer 4. The source electrode 11 is directly in contact with the upper surfaces of the p-type InGaN layer 3 and the n-type conductive region 5 and is in ohmic-contact with the p-type InGaN layer 3 and the n-type conductive region 5. Except for these, the semiconductor device shown in FIG. 5 has the same structure as the semiconductor device shown in FIG. 1.

Figure 6:
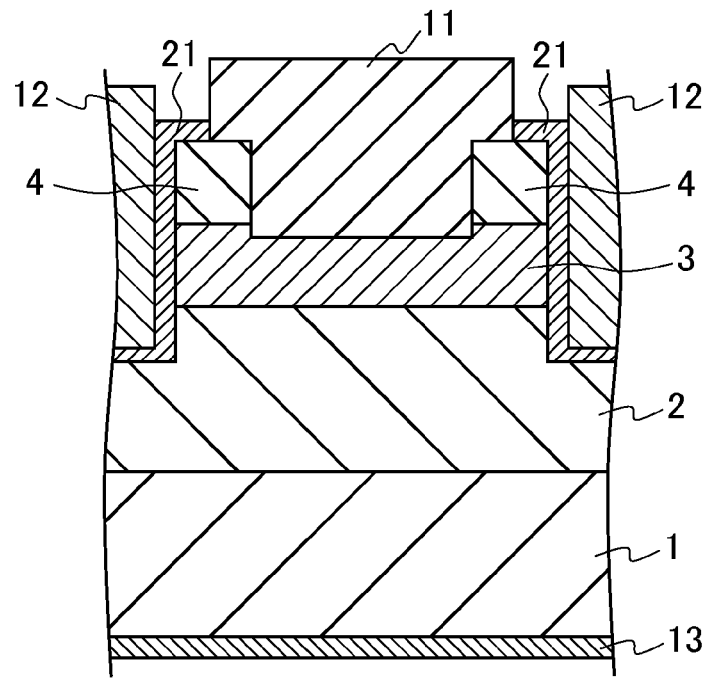
FIG. 6 is a cross sectional view showing another variation of the semiconductor device shown in FIG. 1.

The contact state of the source electrode may be the one shown in FIG. 6, for example. In the semiconductor device shown in FIG. 6, a part of the n-type GaN layer 4 located below the source electrode 11 is removed to form an opening portion to be filled. The source electrode 11 is formed so as to fill the opening portion to be filled. The source electrode 11 is directly in contact with both of the n-type GaN layer 4 (the second semiconductor layer) and the p-type InGaN layer 3 (the p-type semiconductor layer) and is in ohmic-contact with the n-type GaN layer 4 and the p-type InGaN layer 3. Except for these, the semiconductor device shown in FIG. 6 has the same structure as the semiconductor device shown in FIG. 1. The semiconductor devices shown in FIGS. 5 and 6 each have the structure in which the second n-type semiconductor layer is laminated at a part of the upper side of (on a part of the upper surface of) the p-type semiconductor layer.

Figure 7:
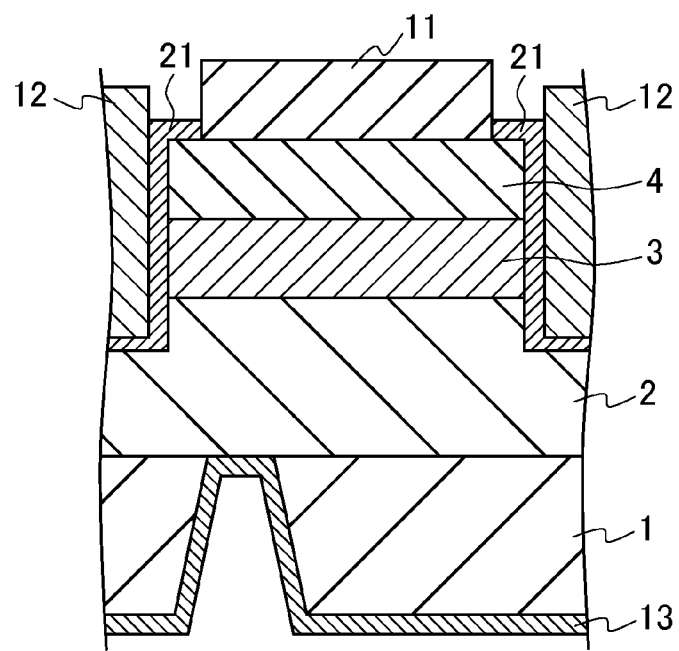
FIG. 7 is a cross sectional view showing yet another variation of the semiconductor device shown in FIG. 1.

The drain electrode 13 is formed on the back surface of the n-type substrate 1 in FIG. 1. For example, as shown in FIG. 7, the drain electrode 13 can be formed such that the drain electrode 13 is connected to the n-type GaN layer 2 via a via hole. More specifically, the structure of the semiconductor device shown in FIG. 7 is as follows. That is, first, in the semiconductor device shown in FIG. 7, a part of the n-type substrate 1 is removed to form a via hole (opening portion to be filled). The drain electrode 13 is formed so as to be in contact with the lower surface of the n-type substrate 1 and so as to fill the via hole (opening portion to be filled) and be directly in contact with the n-type GaN layer 2 (the first semiconductor layer). Thereby, the drain electrode 13 is in ohmic-contact with the n-type GaN layer 2. Except for these, the semiconductor device shown in FIG. 7 has the same structure as the semiconductor device shown in FIG. 1. In the case where more than one structure shown in FIG. 7 is provided continuously from side to side to form a semiconductor device, the via hole is not always necessarily formed for every structure shown in FIG. 7. Although a reasonable effect can be obtained when the semiconductor device includes at least one via hole, the via hole may be formed more than one and may be formed for every structure shown in FIG. 7.

Figure 8:
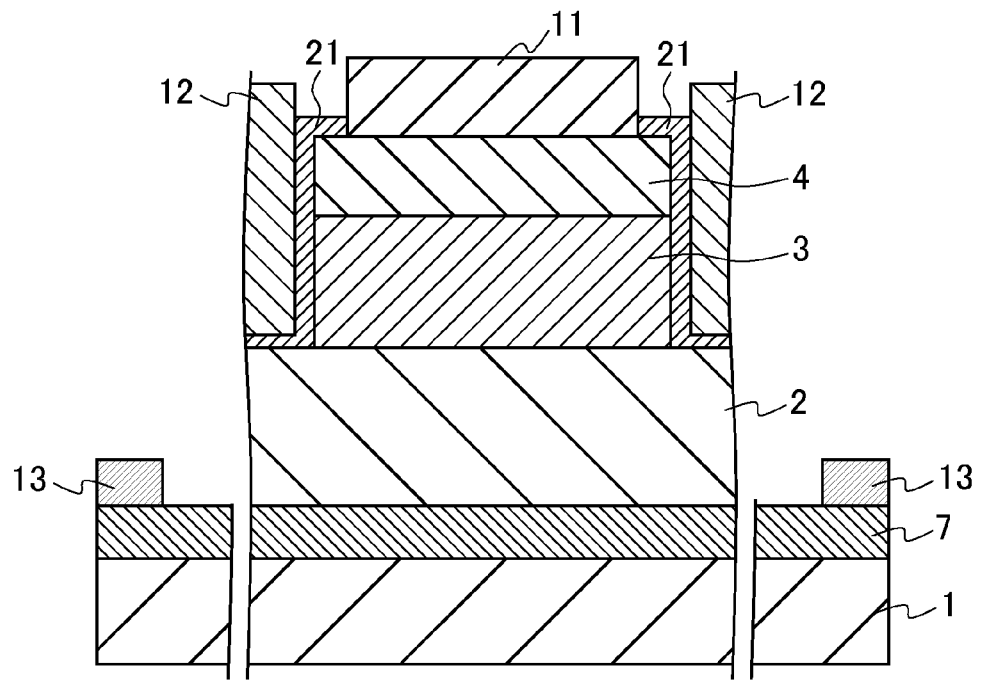
FIG. 8 is a cross sectional view showing still another variation of the semiconductor device shown in FIG. 1.

The contact state of the drain electrode may be a state other than the state in which the drain electrode is in contact with the first n-type semiconductor layer via the substrate. For example, as shown in FIG. 8, a high concentration n-type GaN layer 7 for drain contact may be provided at the lower side of the n-type GaN layer 2 and the drain electrodes 13 may be formed on parts of the upper surface of the high concentration n-type GaN layer 7 exposed from the front surface side. That is, in the semiconductor device shown in FIG. 8, the high concentration n-type GaN layer 7 is formed on the upper surface of the substrate 1. On the upper surface of the high concentration n-type GaN layer 7, the n-type GaN layer 2 (the first n-type semiconductor layer) is formed. Further, the same structures as those shown in FIG. 1 such as the p-type InGaN layer 3 (the p-type semiconductor layer), the n-type GaN layer 4 (the second n-type semiconductor layer), and the like are formed. This structure alone may be employed or this structure may be formed continuously from side to side. At the right and left ends of the semiconductor device shown in FIG. 8, the aforementioned structures are not formed on the upper surface of the high concentration n-type GaN layer 7. The drain electrodes 13 are formed on the upper surface of the high concentration n-type GaN layer 7 at the right and left ends of the semiconductor device in place of the lower surface of the substrate 1.

The semiconductor device of the present invention may have a structure in which the contact states of the source electrodes shown in FIGS. 1, 5, and 6 and the contact state of the drain electrodes shown in FIGS. 7 and 8 are used in free combination or may have a structure other than this. The structure of the semiconductor device of the present invention may be designed with reference to the structure of the semiconductor device shown in FIG. 11A or the like.

In the semiconductor device of the present invention, the materials of the substrate, the semiconductor layers, and the like are not limited to those described above. For example, the substrate is not limited to an n-type Si substrate and can be a high concentration n-type GaN substrate or the like, and is not limited to an n-type substrate and can be a p-type substrate. Further, in the case where the drain electrode is brought into contact with the first n-type semiconductor layer without involving the substrate, the substrate is not necessarily a conductive substrate, and a high-resistivity substrate or an insulating substrate can be employed. Specifically, an example thereof includes the embodiment shown in FIG. 8.

Further, in the vertical GaN FET of the present embodiment, as shown in FIGS. 1 and 2, the p-type InGaN layer 3 has a positive polarization charge at the n-type GaN layer 2 side and a negative polarization charge at the n-type GaN layer 4 side. However, as long as the p-type InGaN layer 3 has a positive polarization charge at the n-type GaN layer 2 side, the composition of each of the n-type GaN layer 2, the p-type InGaN layer 3, and the n-type GaN layer 4 is not particularly limited and any composition can be employed. For example, as described above, each layer may be formed as follows: the n-type GaN layer 2 has composition represented by $Al_xGa_{1-x}N$ (provided that x satisfies the following equation: $0 \le x \le 1$), the p-type InGaN layer 3 has composition represented by $In_yGa_{1-y}N$ (provided that y satisfies the following equation: $0 < y \le 1$), and the n-type GaN layer 4 has composition represented by $Al_zGa_{1-z}N$ (provided that z satisfies the following equation: $0 \le z \le 1$).

The semiconductor device of the present invention is preferably a field effect transistor (FET), although it is not particularly limited. All of the semiconductor devices described with reference to the aforementioned Figures can be used as field effect transistors (FETs).

Embodiment 2

Next, another embodiment of the present invention will be described.

<Structure of Semiconductor Device>

Figure 9:
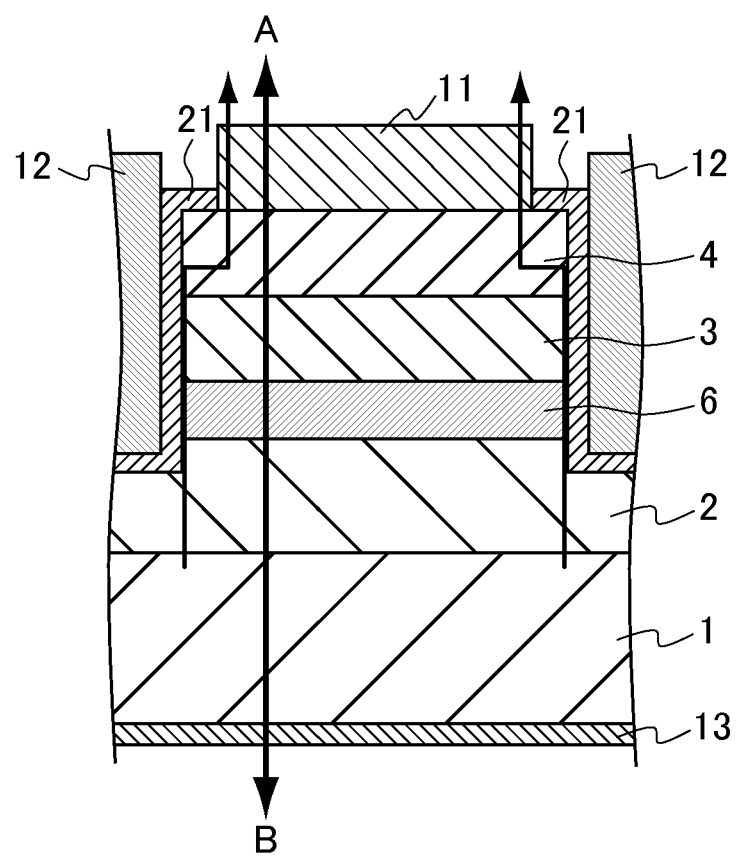
FIG. 9 is a cross sectional view showing the structure of the semiconductor device in another embodiment of the present invention.

FIG. 9 is a cross sectional view schematically showing the structure of the semiconductor device of the present embodiment. This semiconductor device is a vertical GaN FET as with the semiconductor device shown in FIG. 1. As shown in FIG. 9, this semiconductor device further includes a composition modulation layer 6 formed of a semiconductor. The composition modulation layer 6 is in contact with the upper surface of an n-type GaN layer 2 (the first n-type semiconductor layer) and the lower surface of a p-type InGan layer 3 (the p-type semiconductor layer) and is arranged between the first n-type GaN layer 2 and the p-type GaN layer 3. In this semiconductor device, composition of semiconductors that form the interface between the n-type GaN layer 2 and the composition modulation layer 6, the composition modulation layer, and the interface between the p-type InGaN layer 3 and the composition modulation layer continuously or in a stepwise manner in the direction perpendicular to the plane of the substrate 1. The composition in the vicinity of the lower surface of the composition modulation layer 6 is substantially the same as that of the n-type GaN layer 2 and the composition in the vicinity of the upper surface of the composition modulation layer 6 is substantially the same as that of the p-type InGaN layer 3. Further, the composition modulation layer 6 shown in FIG. 9 is an n-type composition modulation layer formed of an n-type semiconductor. Except for these, the semiconductor device shown in FIG. 9 has the same structure as the semiconductor device shown in FIG. 1.

<Production Method of Semiconductor Device>

The method of producing the semiconductor device of the present embodiment is, for example, as follows. First, the semiconductor layers are formed by the molecular beam epitaxy (MBE) growth method at the upper side of the n-type substrate 1 formed of conductive Si. Specifically the n-type GaN drift layer 2 (thickness: 1 μm and doping concentration: $1 \times 10^{17}$ cm$^{-3}$), the n-type composition modulation layer 6 (thickness: 50 nm and doping concentration: $1 \times 10^{17}$ cm$^{-3}$), the p-type In$_{0.2}$Ga$_{0.8}$N channel layer 3 (thickness: 0.1 μm and doping concentration: $5 \times 10^{17}$ cm$^{-3}$), and the n-type GaN cap layer 4 (thickness: 0.1 μm and doping concentration: $5 \times 10^{17}$ cm$^{-3}$) are laminated in this order from the n-type substrate 1 side.

Next, the source electrode 11 and the drain electrode 13 are formed, for example, by vapor deposition of metal such as TiAl on the upper surface of the n-type GaN layer 4 and the lower surface of the n-type substrate 1 respectively. After formation, the source electrode 11 and the drain electrode 13 are respectively brought into ohmic-contact with the n-type GaN layer 4 and the n-type GaN drift layer 2 via the n-type substrate 1 by annealing at 650° C.

Then, parts of the epitaxial layer structure formed of the layers 2, 3, 4, and 6 are removed by etching until the n-type GaN drift layer 2 is exposed. On the surface of the removed areas, for example, Al$_2$O$_3$ is formed as the gate insulation films 21 and then the gate electrodes 12 are formed by vapor deposition of metal such as Ni/Au, for example. In this manner, the vertical GaN FET shown in FIG. 9 can be produced.

Note here that the above description is merely illustrative and the vertical GaN FET shown in FIG. 9 may be produced by a method other than this. As described above, the method of producing the semiconductor device of the present invention is not particularly limited.

<Operation, Effect, Variation, and the Like>

Hereinafter, operations, effects, variations, and the like of the semiconductor device of the present embodiment shown in FIG. 9 will be illustrated.

The semiconductor device of the present embodiment (vertical GaN FET) shown in FIG. 9 can achieve the effect of suppressing a punch-through phenomenon by a polarization charge generated in the p-type InGaN layer 3 as in Embodiment 1. Further, the semiconductor device of the present embodiment can prevent the generation of a notch (a phenomenon in which band energy sharply changes at an interface between layers) between the n-type GaN layer 2 and p-type InGaN layer 3.

Figure 10:
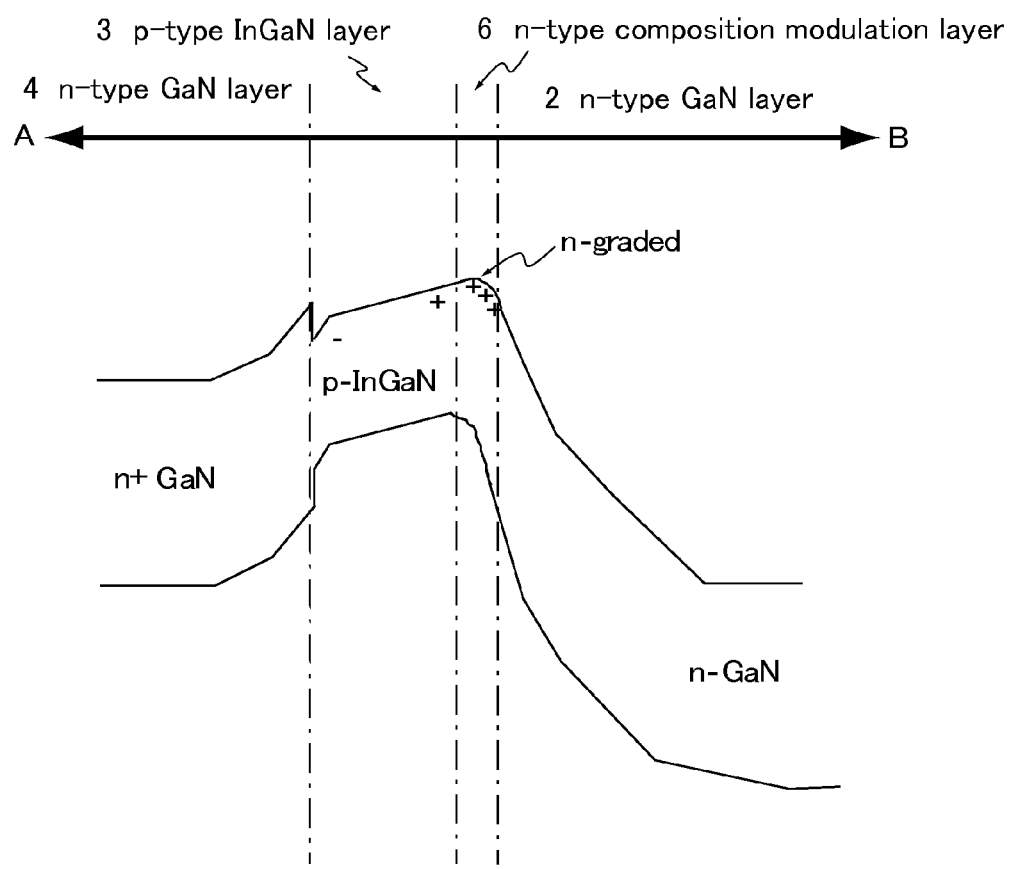
FIG. 10 is a view illustrating the band energy distribution of the semiconductor device shown in FIG. 9.

FIG. 10 is a schematic view illustrating the band energy distribution of the vertical GaN FET of the present embodiment. The line A-B shown in FIG. 10 corresponds to the line A-B shown in FIG. 9, i.e., the band energy distribution of the semiconductor layers between the source electrode and the drain electrode. FIG. 10 shows the band energy distribution from the n-type GaN layer 2 to the n-type GaN layer 4 among the semiconductor layers. In the semiconductor device shown in FIG. 9, a laminate of the p-type InGaN layer 3 and the composition modulation layer 6 has a positive polarization charge at the n-type GaN layer 2 side in the state where a voltage is applied to none of the drain electrode, the source electrode, and the gate electrode. According to the theoretical equations, the total positive polarization charge generated in the n-type composition modulation layer 6 and the p-type InGaN layer 3 of the present embodiment is equal to the positive polarization charge generated in the p-type InGaN layer 3 of the semiconductor device having the structure of Embodiment 1. Therefore, as with Embodiment 1, the semiconductor device of the present embodiment also can achieve the effect of suppressing a punch-through phenomenon by a positive polarization charge. Further, as shown in FIG. 10, the vertical GaN FET of the present embodiment can achieve lower resistance than Embodiment 1 because there is no notch between the p-type InGaN layer 3 and the n-type GaN layer 2 because of the n-type composition modulation layer 6 interposed therebetween.

Preferably, as shown in FIG. 9 for example, the semiconductor device of the present invention further includes a composition modulation layer formed of a semiconductor, wherein composition of the first n-type semiconductor layer is different from that of the p-type semiconductor layer, the composition modulation layer is in contact with the upper surface of the first n-type semiconductor layer and the lower surface of the p-type semiconductor layer and is arranged between the first n-type semiconductor layer and the p-type semiconductor layer, composition of semiconductors that form the interface between the first n-type semiconductor layer and the composition modulation layer, the composition modulation layer, and the interface between the p-type semiconductor layer and the composition modulation layer changes continuously or in a stepwise manner in the direction perpendicular to the plane of the substrate, and a laminate of the p-type semiconductor layer and the composition modulation layer, in place of the p-type semiconductor layer, has a positive polarization charge at the first n-type semiconductor layer side in the state where a voltage is applied to none of the drain electrode, the source electrode, and the gate electrode. Thereby, for example, as described with reference to FIG. 10, the notch between the first n-type semiconductor layer and the p-type semiconductor layer can be resolved or reduced and further low resistance can be achieved.

Although the composition modulation layer shown in FIG. 9 is an n-type, in the present invention, the composition modulation layer is not limited to an n-type and the composition modulation layer can be a p-type composition modulation layer and a layer formed both of an n-type composition modulation layer and a p-type composition modulation layer. Also in the case where the composition modulation layer is a p-type composition modulation layer or a layer formed both of an n-type composition modulation layer and a p-type composition modulation layer, the effect of resolving or reducing the notch can be achieved as in the case where the composition modulation layer is an n-type. In the case where the modulation layer is formed both of an n-type composition modulation layer and a p-type composition modulation layer, preferably, the n-type composition modulation layer is arranged at the first n-type semiconductor layer side and the p-type composition modulation layer is arranged at the p-type semiconductor layer side. In other words, preferably, the n-type composition modulation layer is in contact with the upper surface of the first n-type semiconductor layer and the p-type composition modulation layer is in contact with the upper surface of the p-type semiconductor layer. As described above, in the present invention, preferably, the composition modulation layer is formed one or both of an n-type composition modulation layer and a p-type composition modulation layer, the lower surface of the n-type composition modulation layer is in contact with the upper surface of the first n-type semiconductor layer, and the upper surface of the p-type composition modulation layer is in contact with the lower surface of the p-type semiconductor layer.

Further, in the case where the laminate of the p-type semiconductor layer and the composition modulation layer has a polarization charge at the first n-type semiconductor layer side, "the first n-type semiconductor layer side" refers to the vicinity of the area where the laminate of the p-type semiconductor layer and the composition modulation layer is in contact with the upper surface of the first semiconductor layer, although it is not particularly limited. The vicinity may only include the composition modulation layer and not include the p-type semiconductor layer or may also include the p-type semiconductor layer.

In the present invention, from the same point of view as describe above, other composition modulation layer(s) having a structure similar to that of the aforementioned composition modulation layer may be arranged between the upper surface of the p-type semiconductor layer and the lower surface of the second n-type semiconductor layer. Preferably, the other composition modulation layer(s) is formed one or both of an n-type composition modulation layer and a p-type composition modulation layer, the upper surface of the n-type composition modulation layer is in contact with the lower surface of the second n-type semiconductor layer, and the lower surface of the p-type composition modulation layer is in contact with the upper surface of the p-type semiconductor layer. The other composition modulation layer(s) may be used alone or may be used in combination with the composition modulation layer arranged between the upper surface of the first n-type semiconductor layer and the lower surface of the p-type semiconductor layer.

Further, the semiconductor device of the present embodiment (vertical GaN FET) shown in FIG. 9 allows every kind of variations, for example, based on the various variations described in Embodiment 1. For example, on the basis of FIG. 5, an n-type conductive region may be formed by implanting ions to a part of the p-type InGaN layer 3 and the source electrode 11 may be formed such that it is in contact with both an n-type region and a p-type region. Further, for example, on the basis of FIG. 7, a via hole may be formed in a part of the n-type substrate 1 and the drain electrode 13 may be formed such that it is connected to the n-type InGaN layer 5.

As described above, according to the present invention, a semiconductor device capable of suppressing an occurrence of a punch-through phenomenon can be provided. The semiconductor device of the present invention can achieve a low on-resistance even in a low withstand voltage region because of suppression of a punch-through phenomenon. The semiconductor device of the present invention is preferably a field effect transistor (FET) and particularly preferably a vertical GaN FET, although it is not particularly limited. The uses of the semiconductor device of the present invention are not particularly limited and can be adopted for uses similar to those of field effect transistors (FETs) in general, for example. For example, the semiconductor device of the present invention can be used widely in various household electrical appliances and electronic devices such as communication equipment and the like.

The invention of the present application was described above with reference to the embodiments. However, the invention of the present application is not limited to the above-described embodiments. Various changes that can be understood by those skilled in the art can be made in the configurations and details of the invention of the present application within the scope of the invention of the present application.

This application claims priority from Japanese Patent Application No. 2009-218295 filed on Sep. 22, 2009. The entire subject matter of the Japanese Patent Application is incorporated herein by reference.

| | Explanation of Reference Numerals |
|---|---|
| 1 | n-type substrate |
| 2 | n-type GaN layer (n-type GaN drift layer) |
| 3 | p-type InGaN layer (p-type InGaN channel layer) |
| 4 | n-type GaN layer (n-type GaN cap layer) |
| 5 | n-type conductive region |
| 6 | n-type composition modulation layer |
| 7 | high concentration n-type GaN layer |
| 11 | source electrode |
| 12 | gate electrode |
| 13 | drain electrode |
| 21 | gate insulation film |
| 101 | high concentration n-type GaN substrate |
| 101' | i-type GaN layer |
| 102 | n-type GaN layer |
| 103 | p-type GaN layer (p-type GaN channel layer) |
| 104 | n-type GaN layer (n-type GaN cap layer) |
| 107 | high concentration n-type GaN layer |
| 110 | sapphire substrate |
| 111 | source electrode |
| 112 | gate electrode |
| 113 | drain electrode |
| 121 | gate insulation film |

The invention claimed is:
1. A semiconductor device comprising:
a substrate;
a first n-type semiconductor layer;
a p-type semiconductor layer;
a second n-type semiconductor layer;
a drain electrode;
a source electrode;
a gate electrode; and
a gate insulation film, wherein the first n-type semiconductor layer, the p-type semiconductor layer, and the second n-type semiconductor layer are laimiated at an upper side of the substrate in this order, the drain electrode is in ohmic-contact with the first n-type semiconductor layer, the source electrode is in ohmic-contact with the second n-type semiconductor layer, an opening portion to be filled or a notched portion that extends from an upper surface of the second n-type semiconductor layer to an upper part of the first n-type semiconductor layer is formed at a part of the p-type semiconductor layer and a part of the second n-type semiconductor layer, the gate insulation film is formed so as to cover the opening portion to be filled or the notched portion, the gate electrode is arranged so as to fill the opening portion to be filled or the notched portion via the gate insulation film and is in contact with an upper surface of the first n-type semiconductor layer, side surfaces of the p-type semiconductor layer, and side surfaces of the second n-type semiconductor layer at inner surfaces of the opening portion to be filled or at a surface of the notched portion via the gate insulation film, the p-type semiconductor layer has a positive polarization charge at a first n-type semiconductor layer side in a state where a voltage is applied to none of the drain electrode, the source electrode, and the gate electrode, and the semiconductor device satisfies the following Equation (A)

$$L_{ch} > \sqrt{\frac{2\varepsilon_s(V_{bi}+V_B)}{qN_a\left(1+\frac{N_a}{N_{d1}}\right)}} + \sqrt{\frac{2\varepsilon_s V_{bi}}{qN_a\left(1+\frac{N_a}{N_{d2}}\right)}} \quad (A)$$

$N_{d1}$: impurity concentration of first n-type semiconductor layer (cm$^{-3}$)

$N_{d2}$: impurity concentration of second n-type semiconductor layer (cm$^{-3}$)

$N_a$: impurity concentration of p-type semiconductor layer (cm$^{-3}$)

$L_{ch}$: thickness of p-type semiconductor layer (cm)

q: elementary charge (elementary electric charge) (C)

$\varepsilon_s$: permittivity of semiconductor layer (F/cm)

$V_{bi}$: built-in-potential (V)

$V_B$: withstand voltage of semiconductor device (V).

2. The semiconductor device according to claim 1, wherein the p-type semiconductor layer has a negative polarization charge at a second n-type semiconductor layer side in a state where a voltage is applied to none of the drain electrode, the source electrode, and the gate electrode.

3. The semiconductor device according to claim 1, wherein composition of the first n-type semiconductor layer is different from that of the p-type semiconductor layer.

4. The semiconductor device according to claim 1, wherein the first n-type semiconductor layer, the p-type semiconductor layer, and the second n-type semiconductor layer are each formed of a III-V-nitride semiconductor.

5. The semiconductor device according to claim 1, wherein the first n-type semiconductor layer has composition represented by $Al_xGa_{1-x}N$ (provided that x satisfies the following equation: 0≤x≤1) and the p-type semiconductor layer has composition represented by $In_yGa_{1-y}N$ (provided that y satisfies the following equation: 0<y≤1).

6. The semiconductor device according to claim 5, wherein an In composition ratio y of the p-type semiconductor layer is more than 0.022.

7. The semiconductor device according to claim 1, further comprising:

a composition modulation layer formed of a semiconductor, wherein composition of the first n-type semiconductor layer is different from that of the p-type semiconductor layer, the composition modulation layer is in contact with the upper surface of the first n-type semiconductor layer and a lower surface of the p-type semiconductor layer and is arranged between the first n-type semiconductor layer and the p-type semiconductor layer, composition of semiconductors that form an interface between the first n-type semiconductor layer and the composition modulation layer, the composition modulation layer, and an interface between the p-type semiconductor layer and the composition modulation layer changes continuously or in a stepwise manner in a direction perpendicular to a plane of the substrate, and a laminate of the p-type semiconductor layer and the composition modulation layer, in place of the p-type semiconductor layer, has a positive polarization charge at the first n-type semiconductor layer side in a state where a voltage is applied to none of the drain electrode, the source electrode, and the gate electrode.

8. The semiconductor device according to claim 7, wherein the composition modulation layer is formed one or both of an n-type composition modulation layer and a p-type composition modulation layer, a lower surface of the n-type composition modulation layer is in contact with the upper surface of the first n-type semiconductor layer, and an upper surface of the p-type composition modulation layer is in contact with the lower surface of the p-type semiconductor layer.

9. The semiconductor device according to claim 1, wherein the opening portion to be filled or the notched portion is formed by removing a part of the p-type semiconductor layer and a part of the second n-type semiconductor layer.

10. The semiconductor device according to claim 9, wherein the semiconductor device is a field effect transistor.

11. An electronic device comprising the semiconductor device according to claim 1.

* * * * *